US012796453B2

(12) United States Patent
Zou et al.

(10) Patent No.: US 12,796,453 B2
(45) Date of Patent: Nov. 10, 2026

(54) BACKSIDE METAL-INSULATOR-METAL CAPACITOR

(71) Applicant: International Business Machines Corporation, Armonk, NY (US)

(72) Inventors: Lijuan Zou, Albany, NY (US); Tao Li, Slingerlands, NY (US); Ruilong Xie, Niskayuna, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 18/664,905

(22) Filed: May 15, 2024

(65) Prior Publication Data

US 2025/0357307 A1 Nov. 20, 2025

(51) Int. Cl.

| | |
|---|---|
| ***H10W 20/40*** | (2026.01) |
| ***H10D 84/01*** | (2025.01) |
| ***H10D 84/03*** | (2025.01) |
| ***H10D 84/80*** | (2025.01) |
| ***H10W 20/42*** | (2026.01) |
| ***H10W 20/43*** | (2026.01) |

(52) U.S. Cl.

CPC ...... *H10W 20/496* (2026.01); *H10D 84/0186* (2025.01); *H10D 84/038* (2025.01); *H10D 84/811* (2025.01); *H10W 20/42* (2026.01); *H10W 20/43* (2026.01)

(58) Field of Classification Search

CPC .......................... H10W 20/495; H10W 20/496

See application file for complete search history.

(56) References Cited

U.S. PATENT DOCUMENTS

| | | | | |
|---|---|---|---|---|
| 8,759,947 | B2 | 6/2014 | Tan et al. | |
| 10,546,915 | B2 | 1/2020 | Reznicek et al. | |
| 10,790,263 | B2 | 9/2020 | Lee | |
| 11,062,988 | B2 | 7/2021 | Liao et al. | |
| 11,791,375 | B2 | 10/2023 | Naskar et al. | |
| 2013/0256834 | A1 * | 10/2013 | Tan | H10D 1/692 257/532 |
| 2019/0198481 | A1 | 6/2019 | Lee | |
| 2022/0140069 | A1 | 5/2022 | Naskar et al. | |
| 2022/0293513 | A1 | 9/2022 | Li et al. | |
| 2023/0010409 | A1 * | 1/2023 | Sio | H10D 1/68 |
| 2023/0133157 | A1 * | 5/2023 | Xie | H10D 1/692 257/532 |
| 2025/0293146 | A1 * | 9/2025 | Zhu | H10W 20/20 |

* cited by examiner

*Primary Examiner* — Benjamin P Sandvik

(74) *Attorney, Agent, or Firm* — Scully, Scott, Murphy & Presser, P.C.; Kimberly Zillig

(57) ABSTRACT

A semiconductor device is provided that includes a backside metal-insulator-metal (MIM) capacitor including a first (i.e., upper) metal layer, a capacitor dielectric layer, and a second (i.e., lower) metal layer. The semiconductor device further includes a frontside source/drain contact structure as a top electrode, and the second metal layer as a bottom electrode. The top electrode can contact the backside MIM capacitor through a source/drain region of at least one transistor, or the top electrode can directly contact the backside MIM capacitor.

20 Claims, 12 Drawing Sheets

BACKSIDE METAL-INSULATOR-METAL CAPACITOR

BACKGROUND

The present application relates to semiconductor technology, and more particularly to a semiconductor device including a backside metal-insulator-metal (MIM) capacitor.

A MIM capacitor is a passive component that is commonly employed in radio frequency (RF) circuits, analog circuits and mixed-signal circuits. MIM capacitors resemble a parallel plate capacitor in which a first metal layer and a second metal layer function as an upper electrode and a lower electrode, respectively. These metal layers are separated by a thin dielectric (insulator) layer. The spacing between the two metal layers determines the capacitance value of the MIM capacitor. MIM capacitors have an increased capacitor density and a high linearity which makes them highly attractive in the semiconductor industry.

SUMMARY

A semiconductor device is provided that includes a backside MIM capacitor including a first (i.e., upper) metal layer, a capacitor dielectric layer, and a second (i.e., lower) metal layer. The semiconductor device further includes a frontside source/drain contact structure as a top electrode, and the second metal layer as a bottom electrode. The top electrode can contact the backside MIM capacitor through a source/drain region of at least one transistor, or the top electrode can directly contact the backside MIM capacitor. By placing the MIM capacitor on the backside of the device, space saving and efficient wire routing can be obtained.

In one embodiment of the present application, the semiconductor device includes a frontside MIM capacitor device source/drain contact structure located on at least one source/drain region, and a backside MIM capacitor located beneath the at least one source/drain region. In this embodiment, the frontside MIM capacitor device source/drain contact structure is connected to the backside MIM capacitor through the at least one source/drain region.

In another embodiment of the present application, the semiconductor device includes a frontside MIM capacitor device source/drain contact structure located on at least one source/drain region of a transistor, and a backside MIM capacitor located beneath, and extending through, the at least one source/drain region. In this embodiment, the frontside MIM capacitor device source/drain contact structure directly contacts the backside MIM capacitor through the at least one source/drain region.

DETAILED DESCRIPTION

Figure 1:
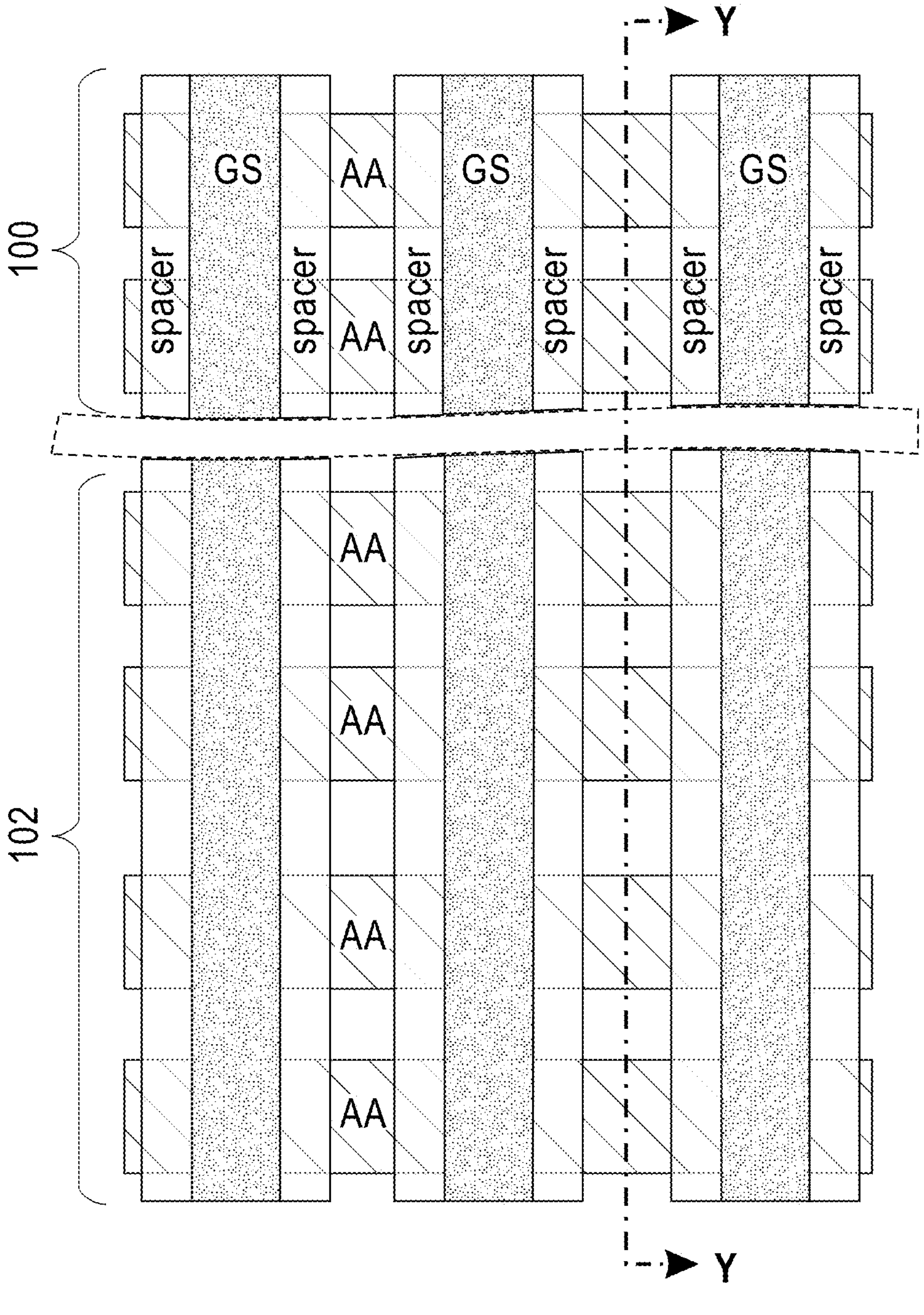
FIG. 1 is a top down view of an exemplary device layout that can be employed in the present application, the device layout includes a logic device region and a MIM capacitor device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 100 deviation in angle.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. The gate structure includes a gate dielectric layer that contacts the semiconductor channel region, and a gate electrode that is located on the gate dielectric layer. In the embodiments described in the present application, the transistor can be a planar transistor, a non-planar transistor (such as, for example, a finFET, a nanosheet transistor, a nanowire FET, a fork sheet transistor), a stacked FET or any combination of such transistors. In the present application, the semiconductor device includes a frontside and a backside. The frontside includes a side of the semiconductor device that includes at least one transistor, frontside contact structures, and a frontside BEOL structure. The backside of the semiconductor device is the side of the device that is opposite the frontside. The backside includes backside contact structures (in logic device regions), and a backside interconnect structure. The backside interconnect structure can be a backside power distribution network that is capable of delivering power to the transistor through the backside of the semiconductor structure. In the present application, and in a MIM capacitor device region, the backside of the semiconductor device includes a backside MIM capacitor. One advantage of placing the MIM capacitor on the backside of the device is to save space on the frontside of the device. Another advantage is better wiring routing.

Referring first to FIG. 1, there is illustrated a top down view of an exemplary device layout that can be employed in the present application. The illustrated device layout includes logic device region 100 and MIM capacitor device region 102. These two regions are located on a same substrate and are spaced apart as shown in FIG. 1. Although FIG. 1 and FIGS. 2-12 to follow illustrate the presence of a logic device region 100, the logic device region 100 can be omitted or replaced with another device region. The logic device region 100 and MIM capacitor device region 102 include active areas, AA, which are oriented parallel to each other. The logic device region 100 and MIM capacitor device region 102 also include gate structures that are oriented parallel to each other, yet each gate structure is oriented perpendicular to each of the active areas. The gate structures can be cut in the region (i.e., non-active device region) that is located between the logic device region 100 and MIM capacitor device region 102. Gate spacers (labeled as spacer in FIG. 1) are shown along each sidewall of the gate structures. FIG. 1 includes a cut Y-Y. Cut Y-Y is located between two adjacent gate structures, GS, and the Y-Y cut includes source/drain regions of the two adjacent gate structures.

Reference is now FIGS. 2-12 in which FIGS. 2-9 illustrate a process flow in accordance with an embodiment of the present application and FIGS. 2-4 and 10-12 illustrate a process flow in accordance with another embodiment of the present application. Each of the process flows provides a semiconductor device in the MIM capacitor region 102 that includes a backside MIM capacitor having a frontside source/drain contact structure as a top electrode, and a backside metal layer as a bottom electrode. In the process flow illustrated in FIGS. 1-9, the top electrode contacts the MIM capacitor through the source/drain regions that are present in the MIM capacitor device region 102. In the process flow illustrated in FIGS. 2-4 and 10-12, the top electrode directly contacts the MIM capacitor.

It is noted that each of FIGS. 2-12 is through cut Y-Y shown in FIG. 1. Thus, the gate structures and gate spacers are not shown in FIGS. 2-12. The gate structures and gate spacers (and semiconductor channel regions) would be located into and out of the plane of each of FIGS. 2-12. For completeness, each gate structure would include a gate dielectric material and a gate electrode, both of which are not shown in any of FIGS. 2-12. As is known to those skilled in the art, a gate dielectric material directly contacts a physically exposed surface(s) of the semiconductor channel region, and a gate electrode is formed on the gate dielectric material. The gate dielectric material typically has a dielectric constant of 4.0 or greater. All dielectric constants mentioned herein are relative to a vacuum unless otherwise noted. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg). The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to, aluminum (Al), tungsten (W), or cobalt (Co).

The gate spacer which is present along the sidewalls of each gate structure is composed of a spacer dielectric material. Illustrative examples of spacer dielectric materials that can be used in providing the gate spacer include, but are not limited to, silicon dioxide, silicon nitride, SiBCN, SiOCN or SiOC.

The semiconductor channel region which can be a planar surface of semiconductor material, a semiconductor fin, at least one semiconductor nanowire, or a vertical stack of spaced apart semiconductor nanosheets is composed of a semiconductor material that has semiconducting properties. Examples of semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors.

Figure 2:
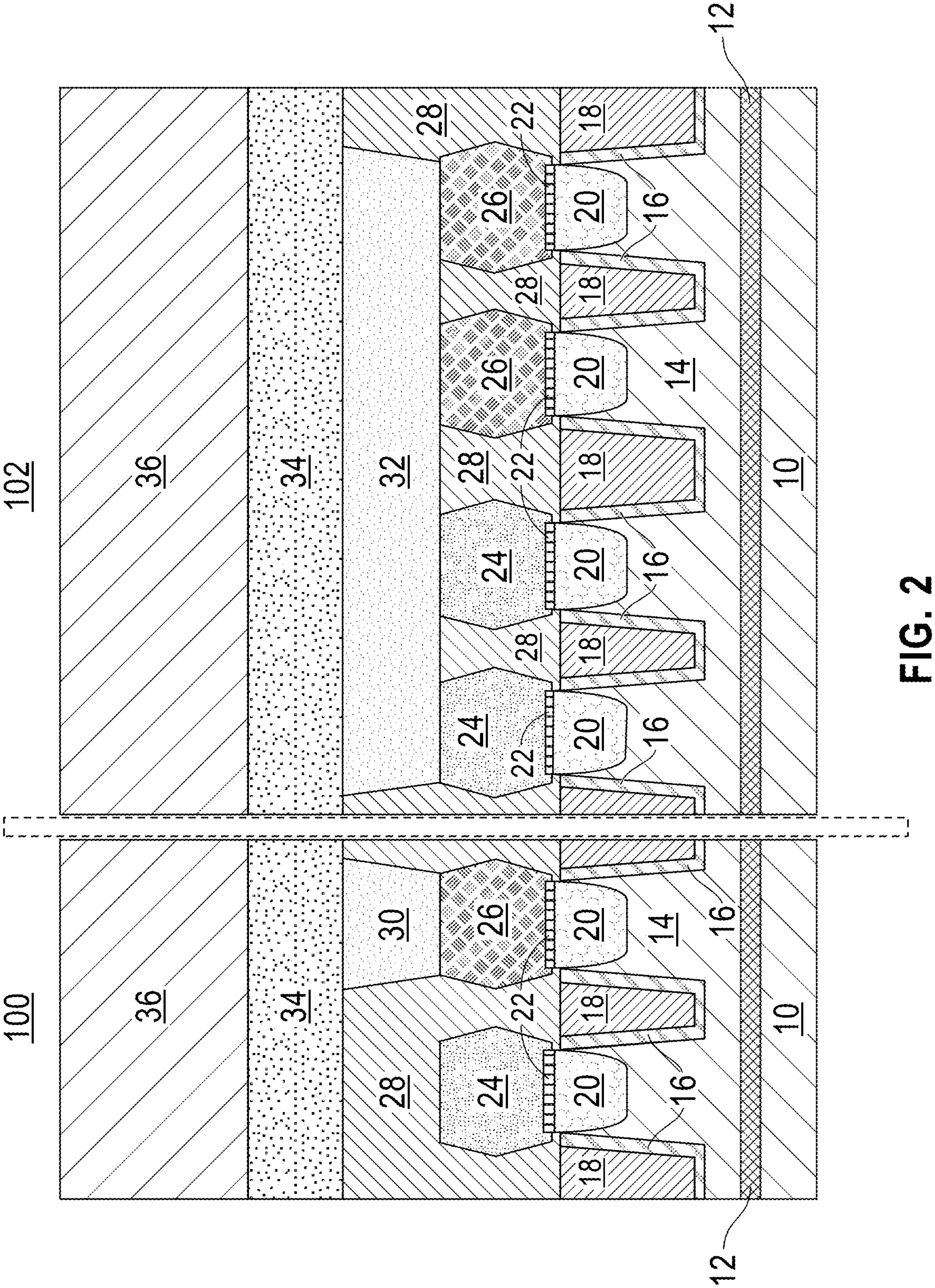
FIG. 2 is a cross sectional view of an exemplary first structure in the logic device region and an exemplary second structure in the MIM device region and through cut Y-Y illustrated in FIG. 1, that can be employed in accordance with an embodiment of the present application.

Referring now to FIG. 2, there is illustrated an exemplary first structure in logic device region 100 and an exemplary second structure in MIM device region 102 that can be employed in accordance with an embodiment of the present application. Each of the exemplary first structure and the exemplary second structure includes a front-end-of-line (FEOL) level that includes a substrate having one or more transistors fabricating thereon utilizing FEOL processing techniques well known to those skilled in the art. Each transistor includes a source/drain region, a semiconductor channel region, as defined above, and a gate structure, as defined above. A gate spacer, as defined above, is present along a sidewall of each transistor. FIG. 2 shows a first source/drain region 24 of a first conductivity type transistor and a second source/drain region 26 of a second conductivity type transistor present in the logic device region 100, and a pair of neighboring first source/drain regions 24 of first conductivity type transistors and a pair of neighboring second source/drain regions 26 of second conductivity type transistors present in the MIM capacitor device region 102. In the present application, the second conductivity type transistors are of an opposite conductivity type than the first conductivity type transistors. In one example, the second conductivity type transistors are p-type transistors, while the first conductivity type transistors are n-type transistors. In other example, the second conductivity type transistors are n-type transistors, while the first conductivity type transistors are p-type transistors. It should be noted that although the present application describes and illustrates different conductivity type transistors present in the logic device region 100 and the MIM device region 102, the present application works when same conductivity type transistors are present in the logic device region 100 and/or the MIM device region 102. Also, and although the present application describes a plurality of transistors present in both the logic device region 100 and the MIM device region 102, the present application works when a single transistor is present in the logic device region 100 and/or the MIM device region 102.

The substrate that is present in both the logic device region 100 and the MIM device region 102 can include a semiconductor base layer 10, an etch stop layer 12, and a semiconductor device layer 14. Embodiments are contemplated in which the semiconductor base layer 10 and/or the etch stop layer 12 are omitted and the substrate includes only the semiconductor device layer 14. The semiconductor base layer 10 is composed of a first semiconductor material, and the semiconductor device layer 14 is composed of a second semiconductor material. The second semiconductor material that provides the semiconductor device layer 14 can be compositionally the same as, or compositionally different from, the first semiconductor material that provides the semiconductor base layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the semiconductor base layer 10 and the second semiconductor material that provides the semiconductor device layer 14. In one example, the semiconductor base layer 10 is composed of silicon, the etch stop layer 12 is composed of silicon dioxide, and the semiconductor device layer 14 is composed of silicon. In another example, the semiconductor base layer 10 is composed of silicon, the etch stop layer 12 is composed of silicon germanium, and the semiconductor device layer 14 is composed of silicon.

Within the substrate, shallow trench isolation structures, as shown in FIG. 2, are typically present. In the illustrated embodiment, the shallow trench isolation structures are present in the semiconductor device layer 14 of the substrate. Each shallow trench isolation structure is located between the different active areas that are present in the logic device region 100 and the MIM device region 102 and between the transistors. Embodiments are contemplated when no shallow trench isolation structure is present between the transistors in a same device region. Each shallow trench isolation structure can include a trench dielectric liner 16 and a trench dielectric material 18. In some embodiments, the trench dielectric liner 16 can be omitted. In one example, the trench dielectric liner 16 is composed of SiN, and the trench dielectric material 18 is composed of silicon dioxide. When present, the trench dielectric liner 16 is present along a sidewall and a bottom wall of the trench dielectric material 18. In some embodiments, each shallow trench isolation structure can have a topmost surface that is substantially coplanar with a topmost surface of the substrate (e.g., the semiconductor device layer 14). In other embodiments, each shallow trench isolation structure can have a topmost surface that is vertically offset (i.e., higher or lower) than a topmost surface of the substrate (e.g., the semiconductor device layer 14). Each trench isolation structure can be formed utilizing techniques well known to those skilled in the art.

Within the substrate, backside source/drain contact placeholder structures 20 as shown in FIG. 2 are typically present. In the illustrated embodiment, the backside source/drain contact placeholder structures 20 are present in the semiconductor device layer 14 of the substrate and are located beneath each of the source/drain regions (e.g., the first source/drain regions 24 and second source/drain regions 26).

Each backside source/drain contact placeholder structure 20 is composed of a fourth semiconductor material. The fourth semiconductor material is compositionally different from the second semiconductor material that provides the semiconductor device layer 14. In one example, the fourth semiconductor material is a silicon germanium alloy. Each backside source/drain contact placeholder structure 20 can be coplanar with, or extend slightly above, the topmost surface of the semiconductor device layer 14. The backside source/drain contact placeholder structures 20 can be formed by forming a placeholder structure trench in an upper portion of the substrate (e.g., the semiconductor device layer 14), and then filling the placeholder structure trench with the fourth semiconductor material. The placeholder trench can be formed by lithography and etching (dry etching and/or wet etching). Dry etching can include, for example, reactive ion etching (RIE), ion beam etching (IBE), and plasma etching. Wet etching includes the use of an appropriate chemical etchant that has a high etch rate for one material as compared to at least one another material. The filling of the placeholder structure trench with the fourth semiconductor material can include a deposition process such, as for example, chemical vapor deposition (CVD), plasma enhanced chemical vapor deposition (PECVD) or epitaxial growth), followed by an etch back process.

In some embodiments (not shown), each backside source/drain contact placeholder structure 20 can be in direct physical contact with an overlying source/drain region (e.g., the first source/drain region 24 or second source/drain region 26). In other embodiments and as is shown in FIG. 2, a semiconductor buffer layer 22 can be positioned between each backside source/drain contact placeholder structure 20 and the overlying source/drain region (e.g., the first source/drain region 24 or second source/drain region 26). The semiconductor buffer layer 22 is composed of a fifth semiconductor material. The fifth semiconductor material is compositionally different from the fourth semiconductor material that provides the backside source/drain contact placeholder structures 20. The semiconductor buffer layer 22 is typically used to facilitate the formation of the source/drain regions (e.g., the first source/drain regions 24 and second source/drain regions 26). The semiconductor buffer layer 22 is generally located above the topmost surface of the substrate (e.g., the topmost surface of the semiconductor device layer 14). The semiconductor buffer layer 22 can be formed by a deposition process such as, for example, CVD, PECVD or epitaxial growth. An etch back process can follow the deposition used in providing the semiconductor buffer layer 22.

Each source/drain region (e.g., the first source/drain region 24 and the second source/drain region 26) is composed of a semiconductor material and a dopant. The dopant can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region (e.g., the first source/drain region 24 or second source/drain region 26) can have a dopant concentration of from $4\times10^{20}$ atoms/cm$^3$ to $3\times10^{20}$ atoms/cm$^3$. The source/drain regions (e.g., the first source/drain region 24 and the second source/drain regions 26) can be formed by a deposition process such as, for example, CVD, PECVD or epitaxial growth. An etch back process can follow the deposition used in providing the source/drain regions (e.g., the first source/drain regions 24 and the second source/drain region 26).

In the specific embodiment illustrated, each first source/drain region 24 is composed of a sixth semiconductor material and a first dopant, and each second source/drain region 26 is composed of a seventh semiconductor material and a second dopant. In some embodiments, the second dopant is of an opposite conductivity type than the first dopant. In other embodiments, the second dopant is of a same conductivity type as the first dopant. In the illustrated embodiment, the sixth semiconductor can be compositionally the same as, or compositionally different from, the seventh semiconductor material.

Also shown in FIG. 2 is a frontside ILD region 28. The frontside ILD region 28 includes at least two frontside ILD layers. The frontside ILD region 28 is composed of at least one ILD material. Illustrative ILD materials that can be used in providing the frontside ILD region 28 include, but are not limited to, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. The frontside ILD region 28 can be formed by a deposition process such as, for example, CVD, PECVD or spin-on coating. A planarization process such as, for example, chemical mechanical polishing (CMP) can follow the deposition of the ILD material. A lower portion of the frontside ILD region 28 embeds the source/drain regions (e.g., the first source/drain regions 24 and the second source/drain region 26), while an upper portion of the frontside ILD region 28 embeds frontside contact structures. The upper portion of the frontside ILD region 28 and the frontside contact structures are typically present in a middle-of-the-line (MOL) level of each of the first and second exemplary structures.

The frontside contact structures include a frontside logic device source/drain contact structure 30 and a frontside MIM capacitor device source/drain contact structure 32. In the present application, the frontside MIM capacitor device source/drain contact structure 32 forms a top electrode of the MIM capacitor that will be subsequently formed in the MIM capacitor device region 102. In the present application, the frontside logic device source/drain contact structure 30 contacts one of the source/drain regions (e.g., the second source/drain region 26) that is present in logic device region 100, while the frontside MIM capacitor device source/drain contact structure 32 is a common contact structure that contacts each of the source/drain regions (e.g., the first source/drain regions 24 and the second source/drain region 26) that are present in the MIM capacitor device region 102. Each of the frontside logic device source/drain contact structure 30 and the frontside MIM capacitor device source/drain contact structure 32 is composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. Each of the frontside logic device source/drain contact structure 30 and the frontside MIM capacitor device source/drain contact structure 32 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. Each of the frontside logic device source/drain contact structure 30 and the frontside MIM capacitor device source/drain contact structure 32 can be formed by a metallization process which includes forming (by lithography and etching) frontside contact openings in the frontside ILD region 28, and then filling each frontside contact opening with at least a contact conductor material as defined above. The filling of each frontside contact opening can include a deposition process (such as, for example, CVD, PECVD, atomic layer deposition (ALD) or sputtering), followed by a planarization process.

After forming the MOL level in each of the logic device region 100 and the MIM capacitor device region 102, a frontside back-end-of-line (BEOL) structure 34 is formed as shown in FIG. 2. The frontside BEOL structure 34 is composed of an interconnect dielectric region having frontside metal wiring embedded therein. The interconnect dielectric region includes one or more interconnect dielectric material layers. The interconnect dielectric material layers can be composed of at least one of the ILD materials mentioned above. The frontside metal wiring can be in the form of metal lines, metal vias, a metal via/metal line combination or any combinations thereof. The frontside metal wiring is composed of an electrically conductive metal or an electrically conductive metal alloy. Illustrative examples of electrically conductive metals that can be used include, but are not limited to, Cu, Al, Co, Ru, Mo, Os, Ir, or Rh. An illustrative electrically conductive alloy that can be used includes, but is not limited to, a Cu—Al alloy. The frontside BEOL structure 34 can be formed utilizing any well-known BEOL process including a damascene process or a subtractive metal etch process. It is noted that the frontside BEOL structure 34 is in contact with the frontside logic device source/drain contact structure 30 and the frontside MIM capacitor device source/drain contact structure 32.

After forming the frontside BEOL structure 34, a carrier wafer 36 as shown in FIG. 2 is formed on the frontside BEOL structure 34. The carrier wafer 36 can include a semiconductor material as defined above. Carrier wafer 36 is bonded to the frontside BEOL structure 36 utilizing any bonding process that is well known to those skilled in the art.

Figure 3:
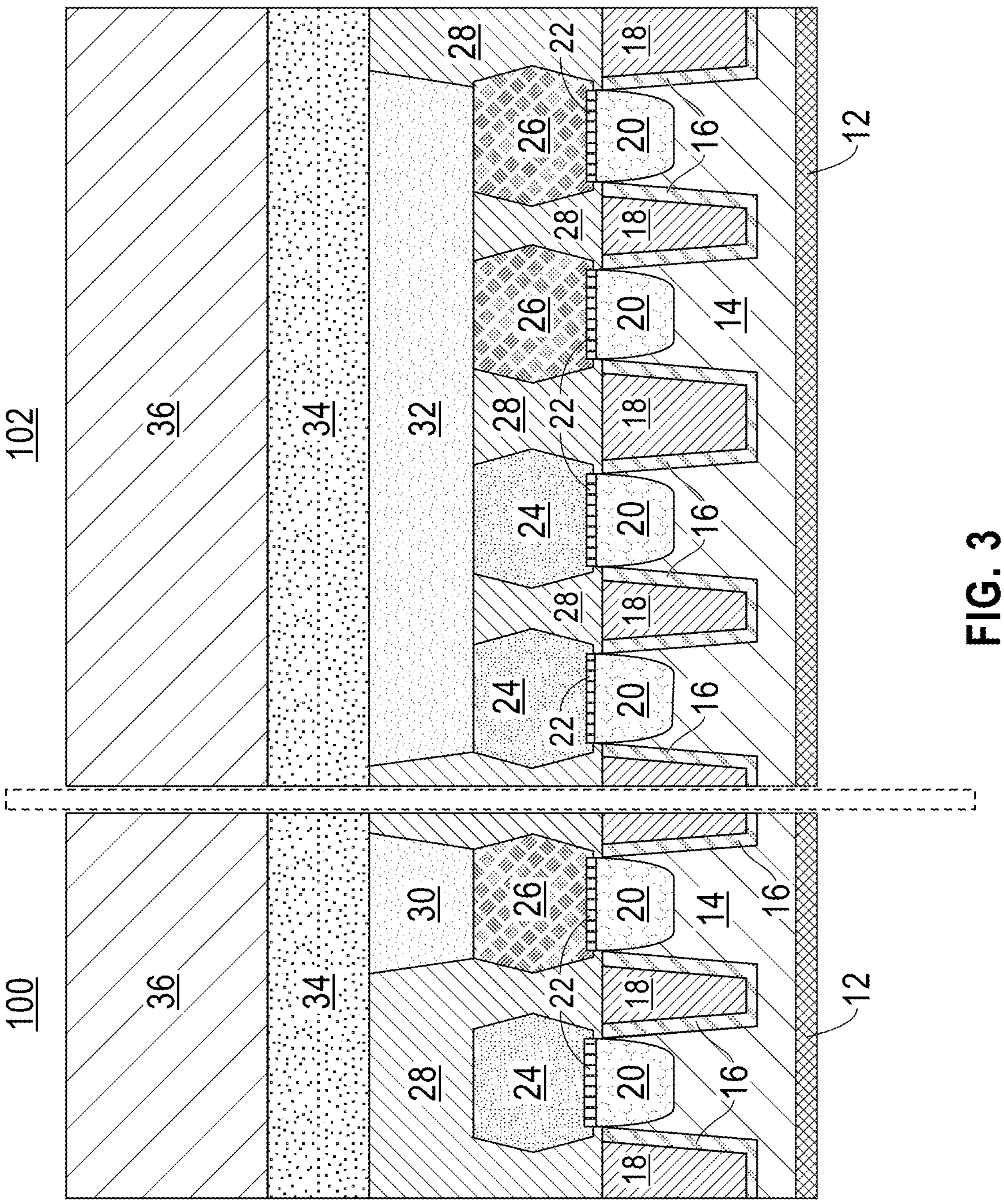
FIG. 3 is a cross sectional view of the exemplary first and second structures of FIG. 2 after removing a semiconductor base layer that is present in both the logic device region and the MIM capacitor device region.

Referring now to FIG. 3, there is illustrated the exemplary first and second structures of FIG. 2 after removing the semiconductor base layer 10 that is present in both the logic device region 100 and the MIM capacitor device region 102. The removal of the semiconductor base layer 10 can be omitted in embodiments in which no semiconductor base layer 10 is present in the substrate. In the illustrated embodiment, the removal of the semiconductor base layer 10 physically exposes the etch stop layer 12 of the substrate. The removal of the semiconductor base layer 10 includes first flipping the exemplary first and second structures shown in FIG. 2 180° to physically expose a backside of the substate. For clarity, the flipping step is not shown in FIG. 3. The flipping step will allow backside processing of the exemplary first and second structures. Backside processing occurs on a side of a substrate (or wafer) opposite the side where the transistors have been formed. Flipping can be performed by hand or by utilizing a mechanical means such as, for example, a robot arm. After flipping, and in the illustrated embodiment, the semiconductor base layer 10 is physically exposed and the physically exposed semiconductor base layer 10 is removed utilizing a material removal process that is selective in removing the semiconductor material that provides the semiconductor base layer 10.

Figure 4:
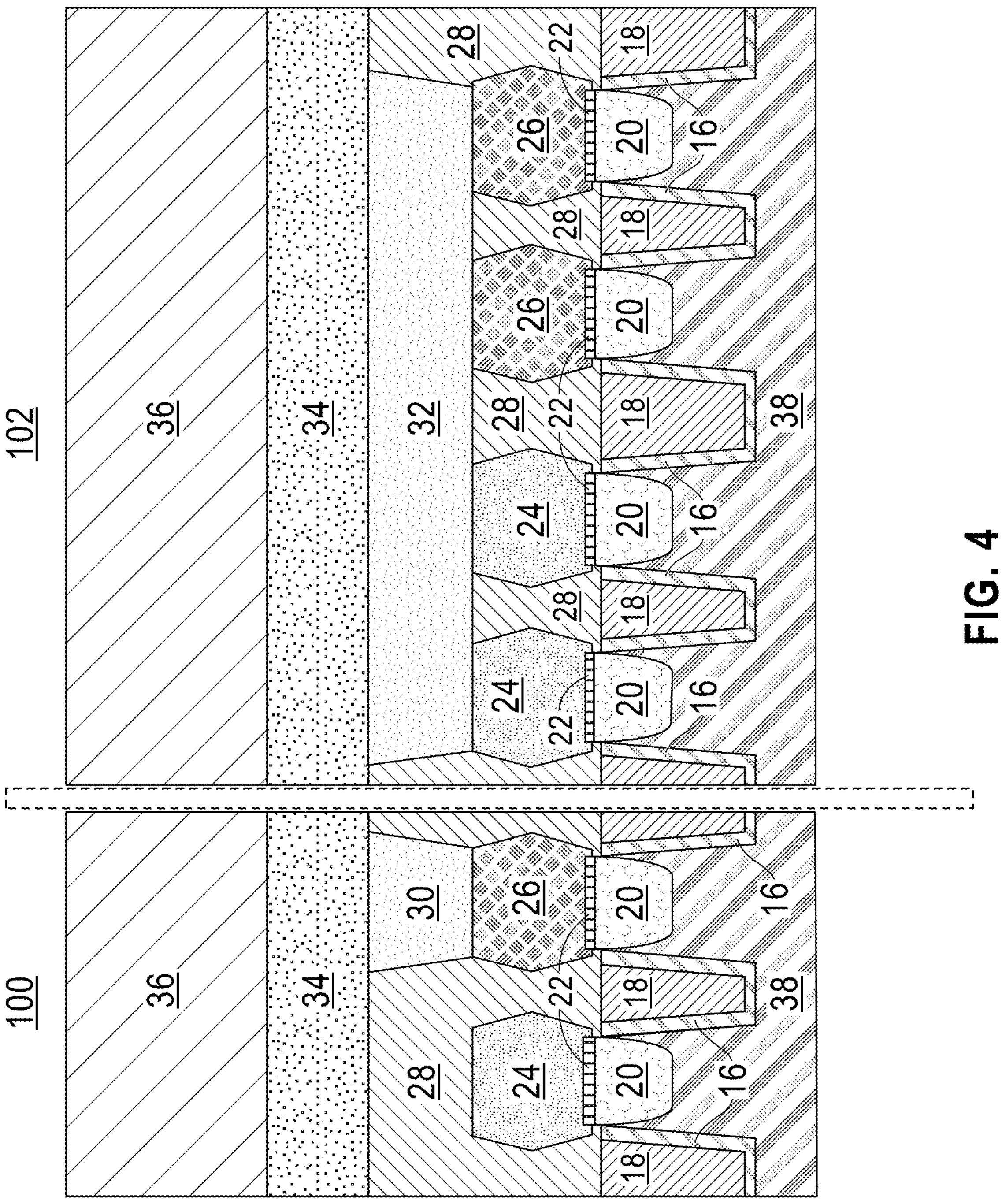
FIG. 4 is a cross sectional view of the exemplary first and second structures of FIG. 3 after removing an etch stop layer and a semiconductor device layer that are present in both the logic device region and the MIM capacitor device region, and forming a first backside interlayer dielectric (ILD) layer.

Referring now to FIG. 4, there is illustrated the exemplary first and second structures of FIG. 3 after removing the etch stop layer 12 and the semiconductor device layer 14 that are present in both the logic device region 100 and the MIM capacitor device region 102, and forming a first backside ILD layer 38. The physically exposed etch stop layer 12 can be removed utilizing a material removal process that is selective in removing the material that provides the etch stop layer 12; this removal step can be omitted in embodiments in which no etch stop layer 12 is present in the substrate. The removal of the etch stop layer 12 physically exposes the semiconductor device layer 14. The semiconductor device layer 14 can be removed to reveal the backside source/drain contact placeholder structures 20 (and the shallow trench isolation structures). The removal of the semiconductor device layer 14 can be performed utilizing a material removal process that is selective in removing the semiconductor material that provides the semiconductor device layer 14. After removing the semiconductor device layer 14, first backside ILD layer 38 formed. The first backside ILD layer 38 embeds each of the backside source/drain contact placeholder structures 20. The first backside ILD layer 38 is composed of an ILD material as mentioned above. The first backside ILD layer 38 can be formed by deposition (e.g., CVD, PECVD or spin-on coating), followed by a planarization process (e.g., CMP).

Figure 5:
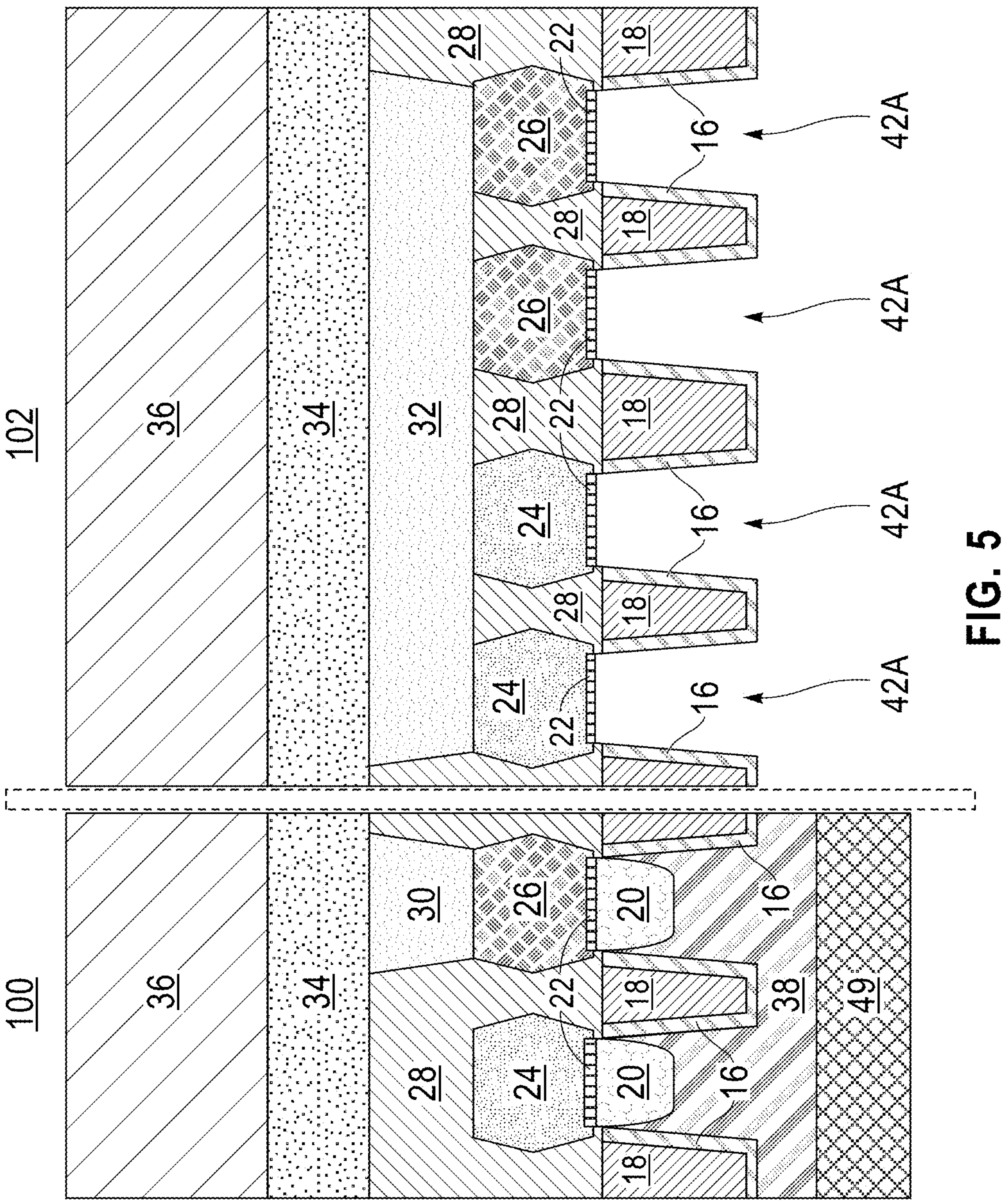
FIG. 5 is a cross sectional view of the exemplary first and second exemplary structures of FIG. 4 after forming a first patterned mask on the first backside ILD layer that is present in the logic device region, and then removing the backside ILD layer and each backside source/drain contact placeholder structure from the MIM capacitor device region.

Referring now to FIG. 5, there is illustrated the exemplary first and second exemplary structures of FIG. 4 after forming a first patterned mask 49 on the first backside ILD layer 38 that is present in the logic device region 100, and then removing the backside ILD layer 38 and each backside source/drain contact placeholder structure 20 from the MIM capacitor device region 102. The first patterned mask 49 serves as a block mask for the logic device region 100. The first patterned mask 49 is composed of a masking material or combination of masking materials. In one example, the masking material is an organic planarization material. The first patterned mask 49 can be formed by deposition of a blanket layer of masking material(s) in the logic device region 100 and the MIM capacitor device region 102, followed by lithography and etching. The deposition of the blanket layer of masking material(s) can include CVD, PECVD, or spin-on coating.

With the first patterned mask 49 protecting the logic device region 100, a first selective etch is used to remove the backside ILD layer 38 from the MIM capacitor device region 102, and thereafter a second selective etch is used to remove each backside source/drain contact placeholder structure 20 from the MIM capacitor device region 102. In some embodiments and as is illustrated in FIG. 5, the second selective etch forms openings 42A in which the semiconductor buffer layer 22 that is located beneath each of the source/drain regions (e.g., the first source/drain regions 24 and the second source/drain regions 26) is physically exposed. In other embodiments and when no semiconductor buffer layer 22 is used, the second selective etch forms openings 42A in which each of the source/drain regions (e.g., the first source/drain regions 24 and the second source/drain regions 26) is physically exposed.

Figure 6:
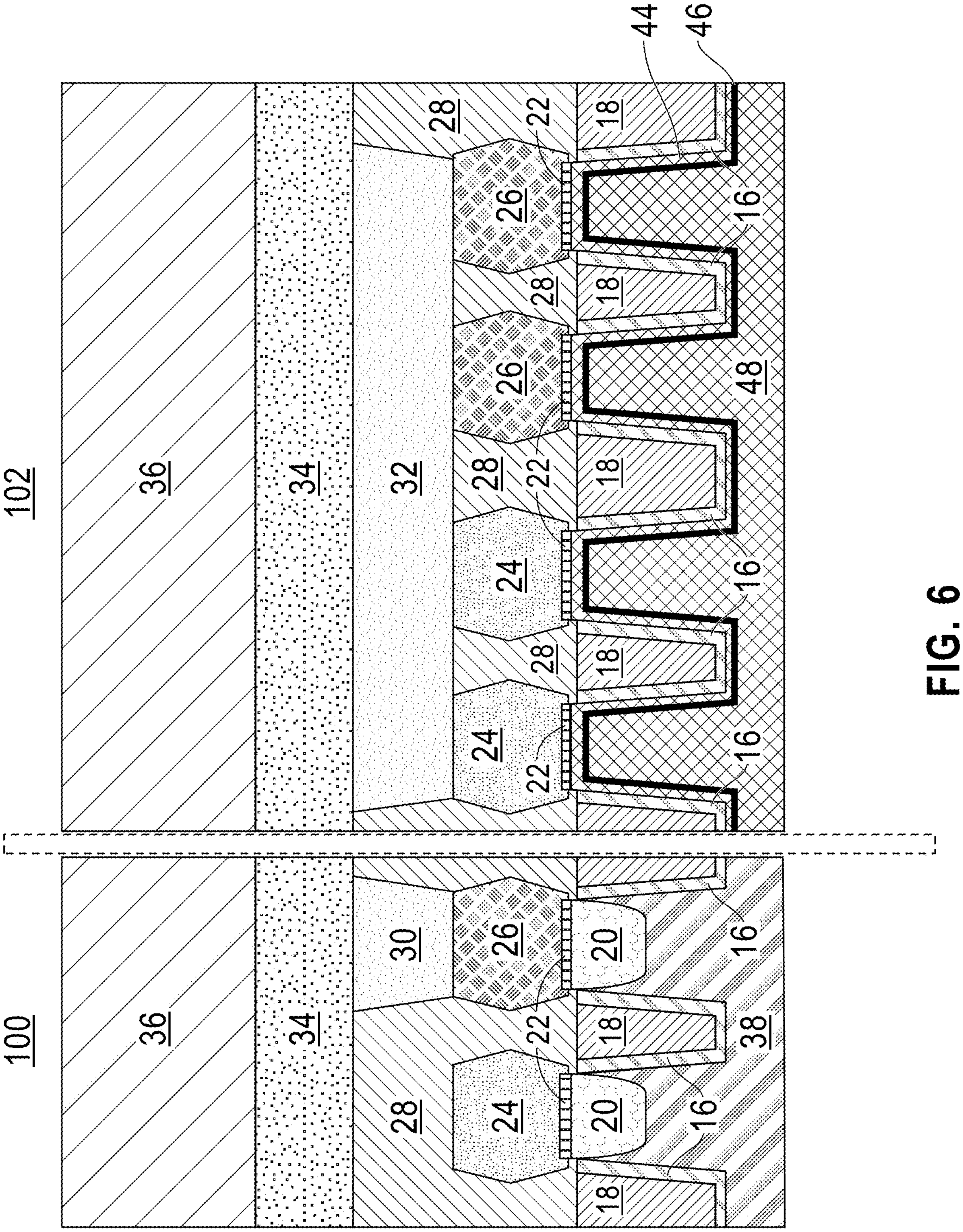
FIG. 6 is a cross sectional view of the exemplary first and second exemplary structures of FIG. 5 after removing the first patterned mask in the logic device region, and forming a backside MIM capacitor in the MIM capacitor device region.

Referring now to FIG. 6, there is illustrated the exemplary first and second exemplary structures of FIG. 5 after removing the first patterned mask 49 in the logic device region 100, and forming a backside MIM capacitor in the MIM capacitor device region 102. The removal of the first patterned mask 49 can be performed utilizing a material removal process such as, for example, ashing, which is selective in removing the masking material(s) that provides the first patterned mask 49. The backside MIM capacitor is then formed in MIM capacitor device region 102. In this embodiment of the present application, a portion of the backside MIM capacitor is formed in each opening 42A mentioned above. The backside MIM capacitor includes a first (or upper) metal layer 44, a capacitor dielectric layer 46 and a second (or bottom) metal layer 48. The first metal layer 44 is composed of a first conductive metal-containing material, while the second metal layer 48 is composed of a second conductive metal-containing material. The first conductive metal-containing material can be compositionally the same as, or compositionally different from, the second conductive metal-containing material. In the present application, the term "conductive metal-containing material" denotes a pure metal, a metal carbide compound or a metal nitride compound. Illustrative conductive metal-containing materials that can be used in providing the first metal layer 44 and the second metal layer 48 include, but are not limited to, hafnium dioxide, aluminum oxide, titanium nitride, tantalum nitride and/or titanium dioxide. The capacitor dielectric layer 46 is composed of a dielectric material such as, for example, one of the gate dielectric materials mentioned above. Typically, the dielectric material that provides the capacitor dielectric layer 46 has a dielectric constant of greater than 4.0 In the present application, the backside MIM capacitor has a meandering (or serpentine) pattern to increase the overall surface area of the capacitor. The backside MIM capacitor can be formed by first depositing (e.g., CVD, PECVD, ALD or sputtering) the first conductive metal-containing material, second depositing (e.g., CVD, PECVD, ALD or physical vapor deposition (PVD)) the dielectric material that provides the capacitor dielectric layer 46, and third depositing (e.g., CVD, PECVD, ALD or sputtering) the second conductive metal-containing material. A planarization process is then used to remove the as-deposited material stack of the first conductive metal-containing material, dielectric material, and the second conductive metal-containing material from the logic device region 100, while maintaining the as-deposited material stack of the first conductive metal-containing material, dielectric material, and the second conductive metal-containing material in the MIM capacitor device region 102. The maintained as-deposited material stack of the first conductive metal-containing material, dielectric material, and the second conductive metal-containing material in the MIM capacitor device region 102 provides the backside MIM capacitor of the present application, Notably, the maintained first conductive metal-containing material provides the first metal layer 44, the maintained dielectric material provides the capacitor dielectric layer 46, the maintained second conductive metal-containing material provides the second metal layer 48 of the backside MIM capacitor. The backside MIM capacitor has finger like protrusions that extend into each opening 42A mentioned above. These finger like protrusions are located between each of the shallow trench isolation structures as shown in FIG. 6.

In the embodiment illustrated in FIG. 6, the first metal layer 44 of the backside MIM capacitor is in direct contact with the semiconductor buffer layer 22 that is physically exposed in each opening 42A. In a non-illustrated embodiment, the first metal layer 44 of the backside MIM capacitor is in direct contact with each of the source/drain regions (i.e., first source/drain regions 24 and second source/drain regions 26) that is physically exposed in each opening 42A.

Figure 7:
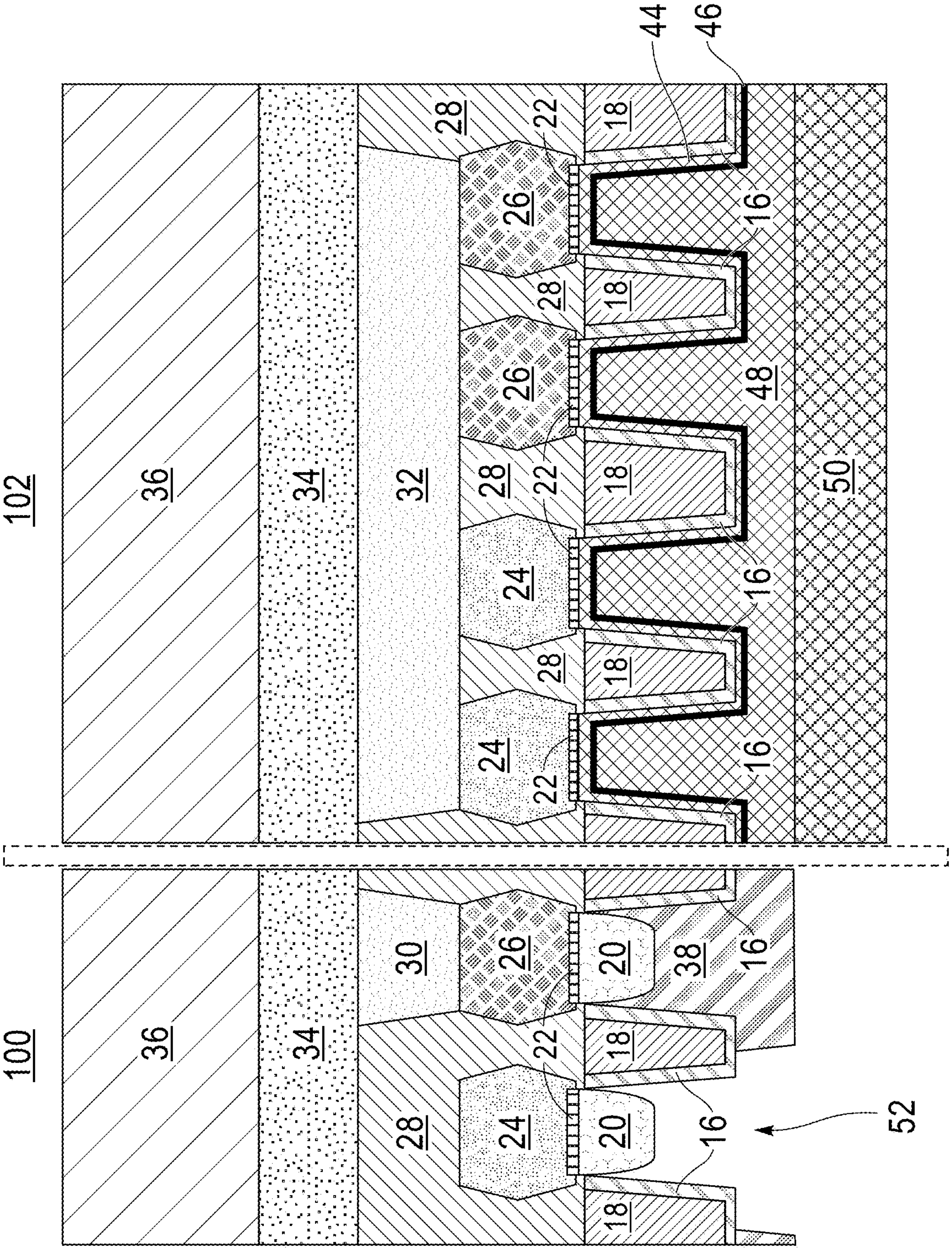
FIG. 7 is a cross sectional view of the exemplary first and second exemplary structures of FIG. 6 after forming a second patterned mask on the MIM capacitor, and forming a backside source/drain contact opening in the logic device region.

Referring now to FIG. 7, there is illustrated the exemplary first and second exemplary structures of FIG. 6 after forming a second patterned mask 50 on the MIM capacitor, and forming a backside source/drain contact opening 52 in the logic device region 100. The second patterned mask 50 serves as a block mask for the MIM capacitor device region 102. The second patterned mask 50 is composed of a masking material or combination of masking materials. In one example, the masking material is an organic planarization material. The second patterned mask 50 can be formed by deposition of a blanket layer of masking material(s) in the logic device region 100 and the MIM capacitor device region 102, followed by lithography and etching. The deposition of the blanket layer of masking material(s) can include CVD, PECVD, or spin-on coating.

The backside source/drain contact opening 52 in the logic device region 100 is formed by lithography and etching. The backside source/drain contact opening 52 physically exposes one of the backside source/drain contact placeholder structures 20 that is present in the logic device region 100. In the illustrated embodiment, the backside source/drain contact opening 52 physically exposes the backside source/drain contact placeholder structure 20 that is located beneath the first source/drain region 24. The backside source/drain contact opening 52 is formed such that the backside source/drain contact placeholder structure 20 that is beneath the source/drain region not including the frontside logic device source/drain contact structure 30 is physically exposed.

Figure 8:
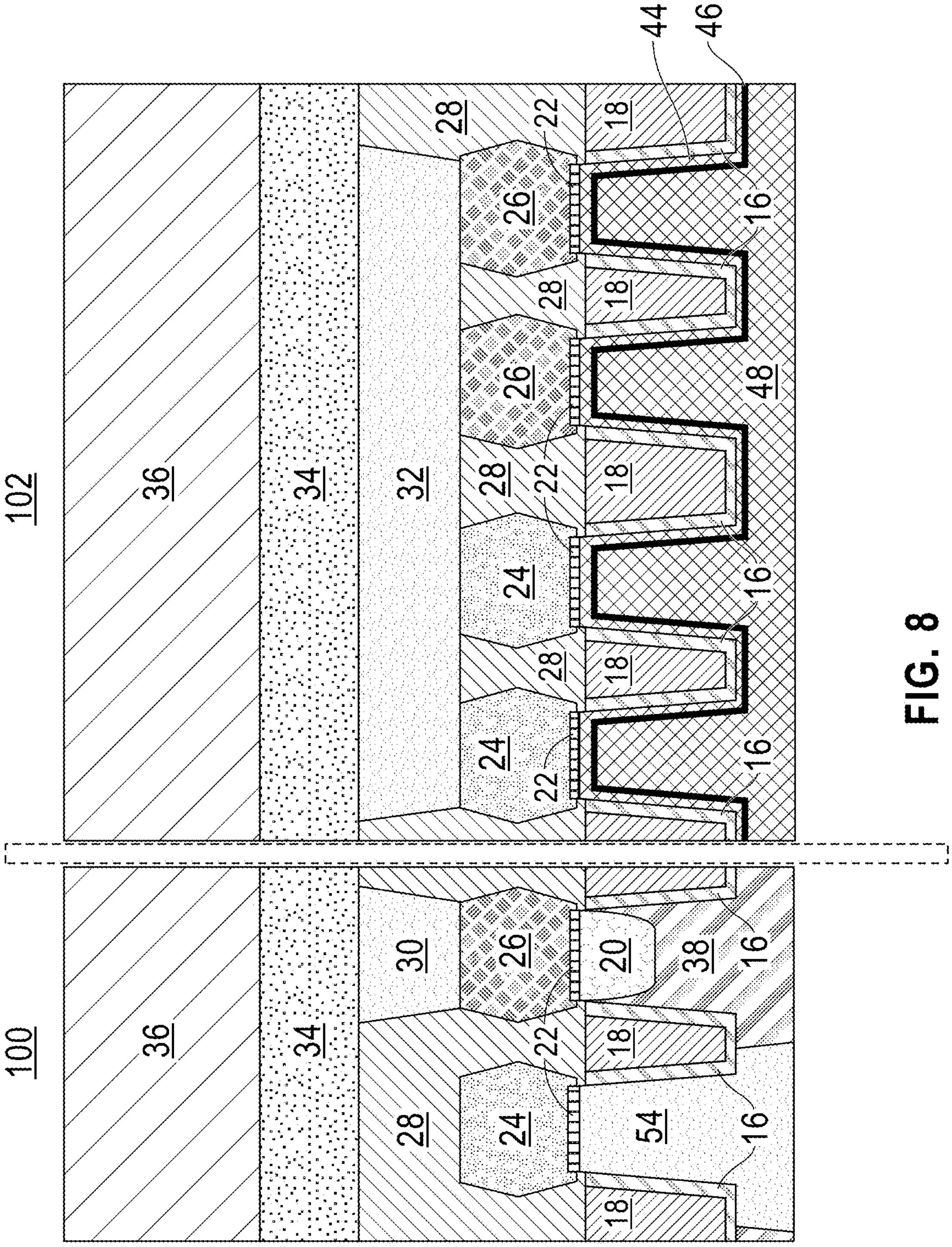
FIG. 8 is a cross sectional view of the exemplary first and second exemplary structures of FIG. 7 after removing the second patterned mask in the MIM capacitor device region, and removing one of the backside source/drain contact placeholder structures present in the logic device region and thereafter forming a logic device backside contact structure in the logic device region.

Referring now to FIG. 8, there is illustrated the exemplary first and second exemplary structures of FIG. 7 after removing the second patterned mask 50 in the MIM capacitor device region 102, and removing the backside source/drain contact placeholder structure 20 that is physically exposed by backside source/drain contact opening 52 and thereafter forming a logic device backside contact structure 54 in the logic device region 100. The removal of the second patterned mask 50 can be performed utilizing a material removal process such as, for example, ashing, which is selective in removing the masking material(s) that provides the second patterned mask 50. The removal of the backside source/drain contact placeholder structure 20 that is physically exposed by backside source/drain contact opening 52 includes an etch that is selective in removing the backside source/drain contact placeholder structure 20. In some embodiments, the removal of the backside source/drain contact placeholder structure 20 that is physically exposed by backside source/drain contact opening 52 physically exposes the semiconductor buffer layer 22. In other embodiments, the removal of the backside source/drain contact placeholder structure 20 that is physically exposed by backside source/drain contact opening 52 physically exposes one of the source/drain region (e.g., the first source/drain region 24) present in the logic device region 100. The logic device backside contact structure 54 is composed of at least a contact conductor material as defined above for the frontside contact structures. The logic device backside contact structure 54 can also include any of the optional liners mentioned above for the frontside contact structures. The logic device backside contact structure 54 is formed by deposition, followed by a planarization process.

Figure 9:
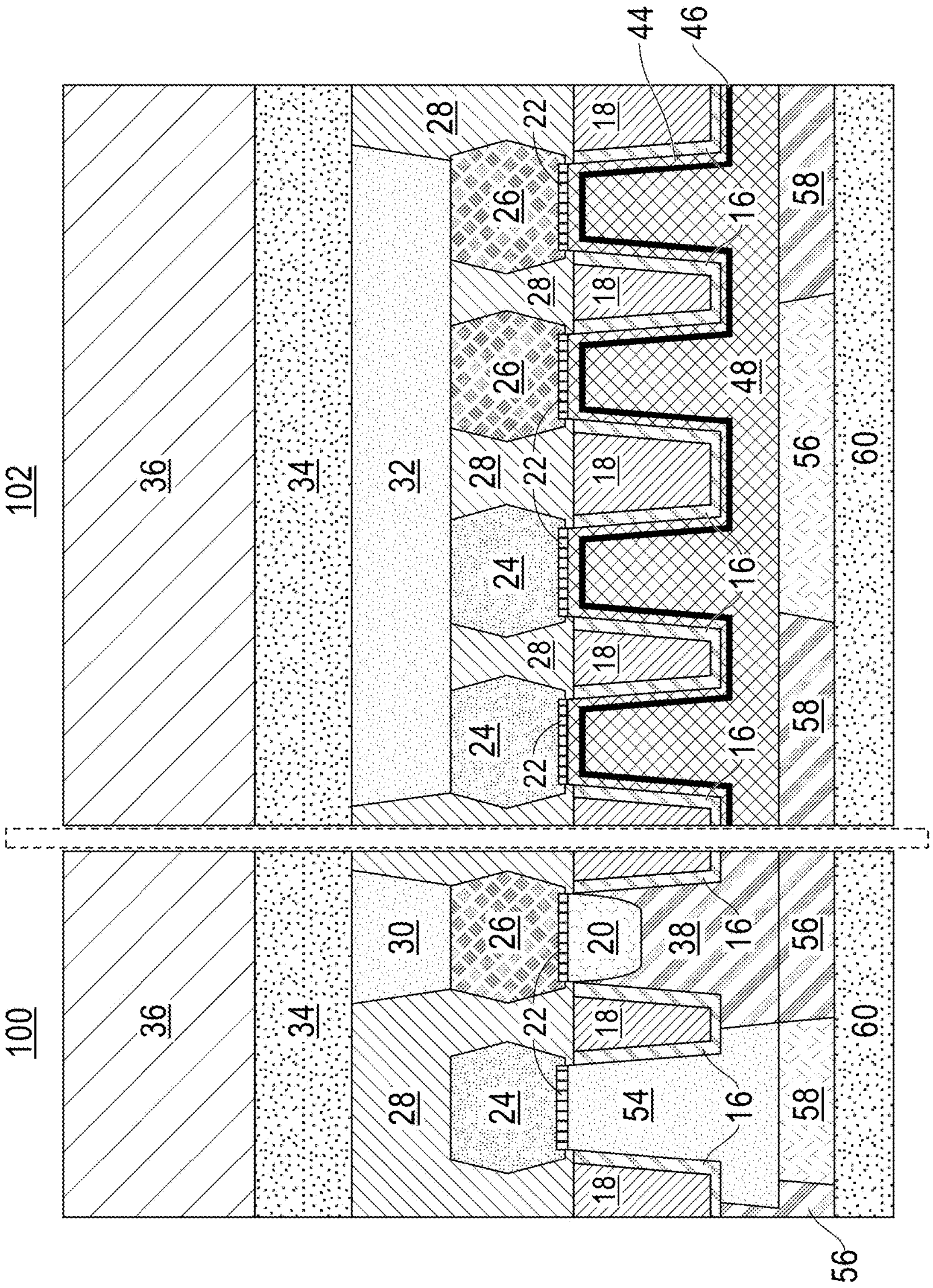
FIG. 9 is a cross sectional view of the exemplary first and second exemplary structures of FIG. 8 after forming a second backside ILD layer having backside vias embedded therein, and a backside interconnect structure in both the logic device region and the MIM capacitor device region.

Referring now to FIG. 9, there is illustrated the exemplary first and second exemplary structures of FIG. 8 after forming a second backside ILD layer 56 having backside via structures 58 embedded therein, and a backside interconnect structure 60 in both the logic device region 100 and the MIM capacitor device region 102. The second backside ILD layer 56 can include an ILD material as defined previously herein. The ILD material that provides the second backside ILD layer 56 can be compositionally the same as, or compositionally different from, the ILD material that provides the first backside ILD layer 38. The backside via structures 58 can be composed of an electrically conductive metal or electrically conductive metal alloy, as both defined above. In one embodiment, the second backside ILD layer 56 and the backside via structures 58 can be formed utilizing a damascene process in which the second backside ILD layer 56 is first deposited, followed by the formation of via openings in the second backside ILD layer 56 and thereafter filling (e.g., deposition and planarization) the via openings with an electrically conductive material to provide the backside via structures 58. Alternatively, the backside via structures 58 can be formed first by deposition and lithographic patterning, followed by embedding the backside via structures 58 in the second backside ILD layer 56. The embedding includes deposition of an ILD material and thereafter planarizing the deposited ILD material. As is shown, the backside via structure 58 that is present in the logic device region 100 contacts the backside source/drain contact structure 54, and the backside via structure 58 that is present in the MIM capacitor device region 102 connects the second metal layer 48 of the MIM capacitor.

The backside interconnect structure 60 is composed of an interconnect dielectric region having backside metal wiring embedded therein. The interconnect dielectric region includes one or more interconnect dielectric material layers. The interconnect dielectric material layers can be composed of one of the ILD materials mentioned above. The backside metal wiring which can be in the form of metal lines, metal vias, a metal via/metal line combination or any combinations thereof is composed of an electrically conductive metal or an electrically conductive metal alloy, as both defined above. The backside interconnect structure 60 can be formed utilizing any well-known BEOL process including a damascene process or a subtractive metal etch process. It is noted that the backside interconnect structure 60 is in contact with the backside via structure 58 that is present in the logic device region 100, and in contact with the backside via structure 58 that is present in the MIM capacitor device region 102.

Notably, and within the MIM capacitor device region 102 of FIG. 9, there is illustrated a semiconductor device in accordance with an embodiment of the present application. The semiconductor device within the MIM capacitor device region 102 of FIG. 9 includes frontside MIM capacitor device source/drain contact structure 32 located on at least one source/drain region (i.e., first source/drain region 24 and/or second source/drain region 26), and a backside MIM capacitor (including first metal layer 44, capacitor dielectric layer 46 and second metal layer 48) located beneath the at least one source/drain region. In this embodiment, the frontside MIM capacitor device source/drain contact structure 32 is connected to the backside MIM capacitor through the at least one source/drain region. In this embodiment, the frontside MIM capacitor device source/drain contact structure 32 serves as a top electrode, and the second metal layer 48 of the backside MIM capacitor serves as a bottom electrode. In the present application, the backside MIM capacitor is a 3D capacitor in which the capacitor dielectric layer 46 between the two electrodes has a serpentine pattern (in an upward and downward manner) which not only increases the insulator area, but does so without increasing lateral space. Thus, a high density MIM capacitor can be fabricated.

In embodiments and as shown in FIG. 9, the semiconductor device in the MIM capacitor device region 102 can include semiconductor buffer layer 22 located between the at least one source/drain region and the backside MIM capacitor. The presence of the semiconductor buffer layer 22 provides a surface that facilitates the growth of the at least one source/drain region thereon.

In embodiments and as shown in FIG. 9, the semiconductor device in the MIM capacitor device region 102 can include backside interconnect structure 60 located beneath the backside MIM capacitor. The backside interconnect structure 60 can be used to deliver power to the backside MIM capacitor and the transistor that are located on the frontside of the exemplary device.

In embodiments and as shown in FIG. 9, the semiconductor device in the MIM capacitor device region 102 includes backside via structure 58 electrically connecting the backside MIM capacitor to the backside interconnect structure 60.

In embodiments and as shown in FIG. 9, the semiconductor device in the MIM capacitor device region 102 includes frontside BEOL structure 34 located above and in contact with the frontside MIM capacitor device source/drain contact structure 32. The frontside BEOL structure 34 can be used to interconnect the MIM capacitor to external components and to deliver signals to the transistors.

In embodiments and as shown in FIG. 9, the backside MIM capacitor has a serpentine pattern. The serpentine pattern provides increased surface area for the backside MIM capacitor.

In embodiments and as shown in FIG. 9, the semiconductor device in the MIM capacitor device region 102 can include a shallow trench isolation structure (including at least trench dielectric material 18) embedding an upper portion of the backside MIM capacitor. The presence of the shallow trench isolation structure provides electrical isolation in the semiconductor device.

In embodiments and as shown in FIG. 9, the backside MIM capacitor includes first metal layer 44, capacitor dielectric layer 46 and second metal layer 48, and the first metal layer 46 directly contacts semiconductor buffer layer 22 that is located beneath the at least one source/drain region.

In embodiments and readily derivable from the semiconductor device in the MIM capacitor device region 102 of FIG. 9, the backside MIM capacitor includes first metal layer 46, capacitor dielectric layer 46 and second metal layer 48, and the first metal layer 46 directly contacts the at least one source/drain region.

In embodiments the at least one source/drain region in the MIM capacitor device region 102 of FIG. 9 includes at least one first source/drain region 24 of a first conductivity type transistor and at least one second source/drain region 26 of a second conductivity type transistor. In such an embodiment, the second conductivity type transistor is of different conductivity type than the first conductivity type transistor.

Figure 10:
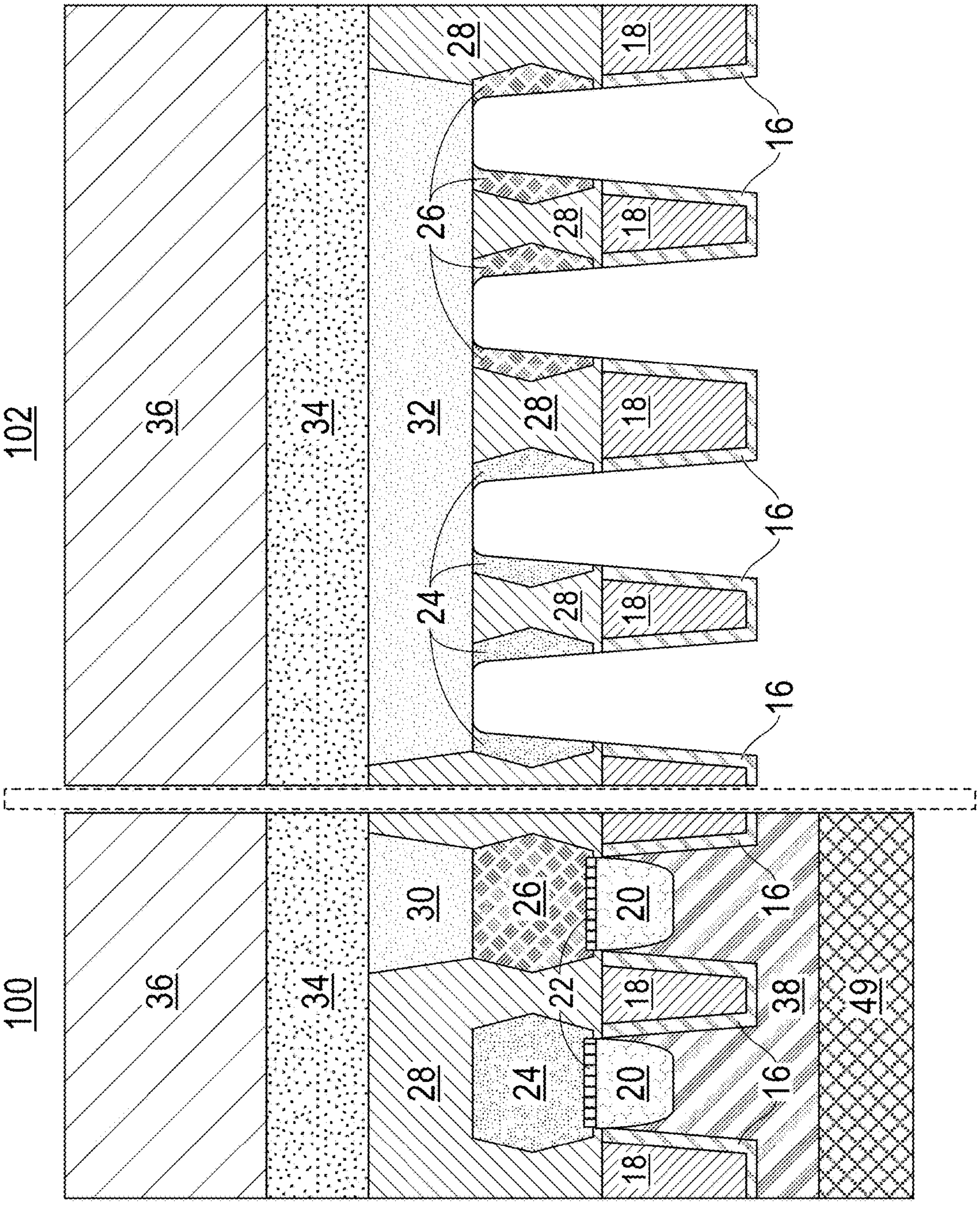
FIG. 10 is a cross sectional view of the exemplary first and second exemplary structures of FIG. 4 after forming a first patterned mask on the first backside ILD layer and in the logic device region, and then removing the backside ILD layer and each backside source/drain contact placeholder structure from the MIM capacitor device region, and thereafter etching through each source/drain region present in the MIM capacitor device region.

Referring now to FIG. 10, there is illustrated the exemplary first and second exemplary structures of FIG. 4 after forming first patterned mask 49 on the first backside ILD layer 38 that is present in the logic device region 100, then removing the backside ILD layer 38 and each backside source/drain contact placeholder structure 20 from the MIM capacitor device region 102, and thereafter etching through each source/drain region (e.g., the first source/drain regions 24 and the second source/drain regions 26) present in the MIM capacitor device region 102. The first block mask 49 is the same as previous described above. The removal of the backside ILD layer 38 and each backside source/drain contact placeholder structure 20 from the MIM capacitor device region 102 is the same as described above. In this embodiment, an etch process is utilized to etch through each source/drain region (e.g., the first source/drain regions 24 and the second source/drain regions 26) present in the MIM capacitor device region 102. The etch process can include a first etch to etch through the semiconductor buffer layer 22 and a second etch to etch through the source/drain regions present in the MIM capacitor device region 102. In some embodiments, a single etch can be used to etch through both the semiconductor buffer layer 22 and the source/drain regions present in the MIM capacitor device region 102. In yet another embodiment and when the semiconductor buffer layer 22 is not present, the etch process includes an etch that etches through each of the source/drain regions present in the MIM capacitor device region 102. In any case, the etch process physically exposed a surface of the frontside MIM capacitor device source/drain contact structure 32.

Figure 11:
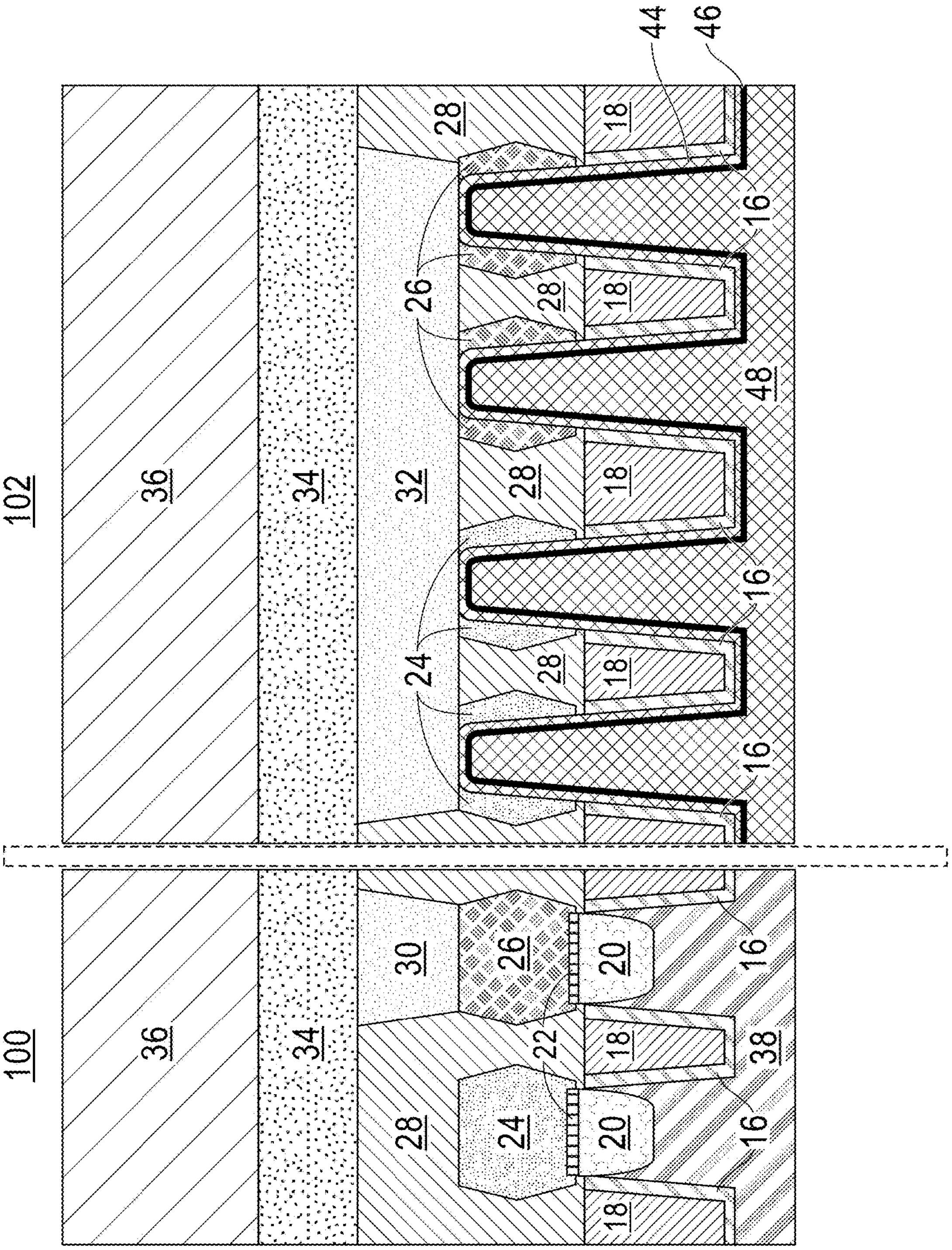
FIG. 11 is a cross sectional view of the exemplary first and second exemplary structures of FIG. 10 after removing the first patterned mask in the logic device region, and forming a backside MIM capacitor in the MIM capacitor device region.

Referring now to FIG. 11, there is illustrated the exemplary first and second exemplary structures of FIG. 10 after removing the first patterned mask 49 in the logic device region 100, and forming a backside MIM capacitor in the MIM capacitor device region 102. The removal of the first patterned mask 49 and the forming of the backside MIM capacitor are the same as described above. The backside MIM capacitor includes first (or upper) metal layer 44 as defined above, capacitor dielectric layer 46 as defined above, and a second (or bottom) metal layer 48, as defined above. The backside MIM capacitor can have a serpentine pattern. The backside MIM capacitor has finger like protrusions that extend through each of the source/drain regions present in the MIM capacitor device region 102. In the embodiment illustrated in FIG. 11, the first metal layer 44 of the backside MIM capacitor is in direct contact with frontside MIM capacitor device source/drain contact structure 32.

Figure 12:
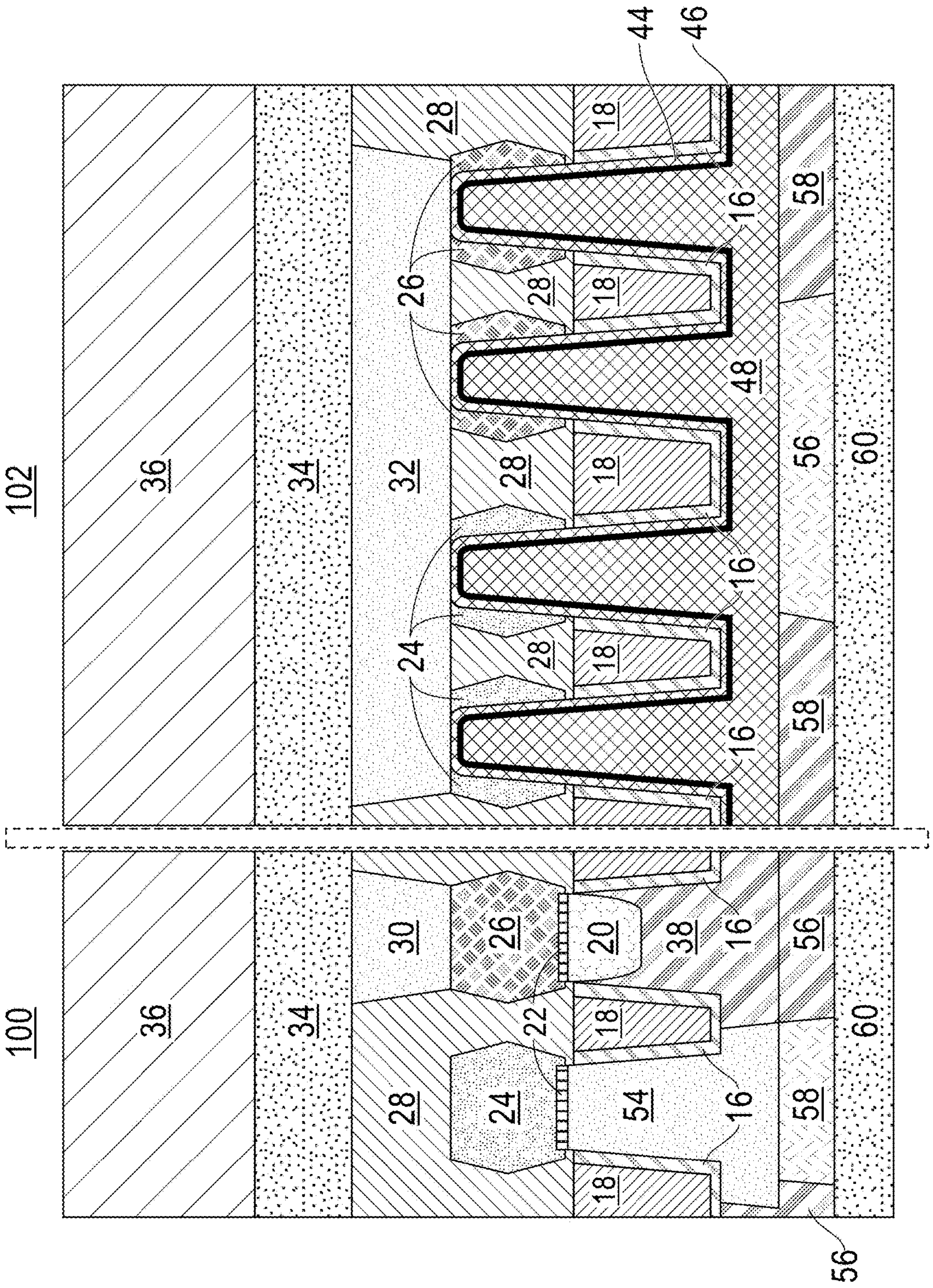
FIG. 12 is a cross sectional view of the exemplary first and second exemplary structures of FIG. 11 after further backside processing.

Referring now to FIG. 12, there is illustrated the exemplary first and second exemplary structures of FIG. 11 after further backside processing. The further backside processing includes the processing and formation of the elements shown in FIGS. 7-9 above.

Notably, and within the MIM capacitor device region 102 of FIG. 12, there is illustrated a semiconductor device in accordance with an embodiment of the present application. The semiconductor device in the MIM capacitor device region 102 of FIG. 12 includes frontside MIM capacitor device source/drain contact structure 32 located on at least one source/drain region (i.e., first source/drain region 24 and/or second source/drain region 26), and a backside MIM capacitor (including the first metal layer 44, the capacitor dielectric layer 46 and the second metal layer 48) located beneath, and extending through, the at least one source/drain region. In the embodiment illustrated in FIG. 12, the frontside MIM capacitor device source/drain contact structure 32 directly contacts the backside MIM capacitor through the at least one source/drain region. In this embodiment, the frontside MIM capacitor device source/drain contact structure 32 serves as a top electrode, and the second metal layer of the backside MIM capacitor serves as a bottom electrode. In the present application, the backside MIM capacitor is a 3D capacitor in which the capacitor dielectric layer 46 between the two electrodes has a serpentine pattern (in an upward and downward manner) which not only increases the insulator area, but does so without increasing lateral space. Thus, a high density MIM capacitor can be fabricated.

In embodiments and as shown in FIG. 12, the semiconductor device in the MIM capacitor device region 102 can include backside interconnect structure 60 located beneath the backside MIM capacitor. The backside interconnect structure 60 can be used to deliver power to the backside MIM capacitor and the transistors that are located on the frontside of the device.

In embodiments and as shown in FIG. 12, the semiconductor device in the MIM capacitor device region 102 includes backside via structure 58 electrically connecting the backside MIM capacitor to the backside interconnect structure 60.

In embodiments and as shown in FIG. 12, the semiconductor device in the MIM capacitor device region 102 includes frontside BEOL structure 34 located above and in contact with the frontside MIM capacitor device source/drain contact structure 32. The frontside BEOL structure 34 can be used to interconnect the MIM capacitor to external components.

In embodiments and as shown in FIG. 12, the backside MIM capacitor has a serpentine pattern. The serpentine pattern provide increased surface area for the backside MIM capacitor.

In embodiments and as shown in FIG. 12, the semiconductor device in the MIM capacitor device region 102 can include a shallow trench isolation structure (including at least trench dielectric material 18) embedding an upper portion of the backside MIM capacitor. The presence of the shallow trench isolation structure provides electrical isolation in the semiconductor device.

In embodiments and as shown in FIG. 12, the backside MIM capacitor includes first metal layer 44, capacitor dielectric layer 46 and second metal layer 48, and the first metal layer 46 directly contacts the frontside MIM capacitor device source/drain contact structure 32.

In embodiments and as shown in FIG. 12, the first metal layer 44 directly contacts the a sidewall of the at least one source/drain region.

In embodiments and as shown in FIG. 12, the backside MIM capacitor includes first metal layer 44, capacitor dielectric layer 46 and second metal layer 48, and the first metal layer 44 has a topmost surface that is substantially coplanar with a topmost surface of the at least one source/drain region.

In embodiments the at least one source/drain region in the MIM capacitor device region 102 of FIG. 12 includes at least one first source/drain region 24 of a first conductivity type transistor and at least one second source/drain region 26 of a second conductivity type transistor. In such an embodiment, the second conductivity type transistor is of different conductivity type than the first conductivity type transistor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a frontside metal-insulator-metal (MIM) capacitor device source/drain contact structure located on at least one source/drain region; and a backside MIM capacitor located beneath the at least one source/drain region, wherein the frontside MIM capacitor device source/drain contact structure is connected to the backside MIM capacitor through the at least one source/drain region.

2. The semiconductor device of claim 1, further comprising a semiconductor buffer layer located between the at least one source/drain region and the backside MIM capacitor.

3. The semiconductor device of claim 1, further comprising a backside interconnect structure located beneath the backside MIM capacitor.

4. The semiconductor device of claim 3, further comprising a backside via structure electrically connecting the backside MIM capacitor to the backside interconnect structure.

5. The semiconductor device of claim 1, further comprising a frontside back-end-of-the-line (BEOL) structure located above and in contact with the frontside MIM capacitor device source/drain contact structure.

6. The semiconductor device of claim 1, wherein the backside MIM capacitor has a serpentine pattern.

7. The semiconductor device of claim 1, further comprising a shallow trench isolation structure embedding an upper portion of the backside MIM capacitor.

8. The semiconductor device of claim 1, wherein the backside MIM capacitor comprises a first metal layer, a capacitor dielectric layer and a second metal layer, and the first metal layer directly contacts a semiconductor buffer layer that is located beneath the at least one source/drain region.

9. The semiconductor device of claim 1, wherein the backside MIM capacitor comprises a first metal layer, a capacitor dielectric layer and a second metal layer, and the first metal layer directly contacts the at least one source/drain region.

10. The semiconductor device of claim 1, wherein the at least one source/drain region comprises at least one first source/drain region of a first conductivity type transistor and at least one second source/drain region of a second conductivity type transistor, wherein the second conductivity type transistor is of different conductivity type than the first conductivity type transistor.

11. A semiconductor device comprising:

a frontside metal-insulator-metal (MIM) capacitor device source/drain contact structure located on at least one source/drain region of a transistor; and a backside MIM capacitor located beneath, and extending through, the at least one source/drain region, wherein the frontside MIM capacitor device source/drain contact structure directly contacts the backside MIM capacitor through the at least one source/drain region.

12. The semiconductor device of claim 11, further comprising a backside interconnect structure located beneath the backside MIM capacitor.

13. The semiconductor device of claim 12, further comprising a backside via structure electrically connecting the backside MIM capacitor to the backside interconnect structure.

14. The semiconductor device of claim 11, further comprising a frontside back-end-of-the-line (BEOL) structure located above and in contact with the frontside MIM capacitor device source/drain contact structure.

15. The semiconductor device of claim 11, wherein the backside MIM capacitor has a serpentine pattern.

16. The semiconductor device of claim 11, further comprising a shallow trench isolation structure embedding a portion of the backside MIM capacitor.

17. The semiconductor device of claim 11, wherein the backside MIM capacitor comprises a first metal layer, a capacitor dielectric layer and a second metal layer, and the first metal layer directly contacts the frontside MIM capacitor device source/drain contact structure.

18. The semiconductor device of claim 17, wherein the first metal layer directly contacts the a sidewall of the at least one source/drain region.

19. The semiconductor device of claim 11, wherein the backside MIM capacitor comprises a first metal layer, a capacitor dielectric layer and a second metal layer, and the first metal layer has a topmost surface that is substantially coplanar with a topmost surface of the at least one source/drain region.

20. The semiconductor device of claim 11, wherein the at least one source/drain region comprises at least one first source/drain region of a first conductivity type transistor and at least one second source/drain region of a second conductivity type transistor, wherein the second conductivity type transistor is of different conductivity type than the first conductivity type.

* * * * *